US007306675B2

(12) United States Patent
Yuri

(10) Patent No.: US 7,306,675 B2
(45) Date of Patent: Dec. 11, 2007

(54) METHOD FOR MANUFACTURING SEMICONDUCTOR SUBSTRATE

(75) Inventor: Masaaki Yuri, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/145,149

(22) Filed: May 15, 2002

(65) Prior Publication Data
US 2002/0170488 A1 Nov. 21, 2002

(30) Foreign Application Priority Data
May 18, 2001 (JP) .............................. 2001-149097

(51) Int. Cl.
*C30B 25/02* (2006.01)
(52) U.S. Cl. ........................... 117/89; 117/84; 117/902; 117/904; 117/952
(58) Field of Classification Search .................. 117/84, 117/87, 902, 904, 952
See application file for complete search history.

(56) References Cited

U.S. PATENT DOCUMENTS

| 5,744,825 | A | * | 4/1998 | Zachai et al. ................. 257/77 |
| 6,071,795 | A | | 6/2000 | Cheung et al. |
| 6,086,673 | A | * | 7/2000 | Molnar ......................... 117/90 |
| 6,090,300 | A | * | 7/2000 | Walker et al. ................. 216/2 |
| 6,210,479 | B1 | * | 4/2001 | Bojarczuk et al. ............ 117/84 |
| 6,342,405 | B1 | * | 1/2002 | Major et al. .................. 438/46 |
| 6,492,661 | B1 | * | 12/2002 | Chien et al. ................... 257/98 |
| 6,501,154 | B2 | * | 12/2002 | Morita et al. ................ 257/628 |
| 6,537,513 | B1 | * | 3/2003 | Amano et al. ........... 423/328.2 |
| 6,673,149 | B1 | * | 1/2004 | Solomon et al. .............. 117/90 |
| 2003/0033974 | A1 | * | 2/2003 | Ueda ............................ 117/84 |
| 2003/0151064 | A1 | * | 8/2003 | Ohno et al. ................. 257/192 |
| 2004/0079959 | A1 | * | 4/2004 | Udagawa ..................... 257/103 |

FOREIGN PATENT DOCUMENTS

EP 951077 A2 * 10/1999

(Continued)

OTHER PUBLICATIONS

Patent Abstracts of Japan. Engish Abstract of JP 05-206026 (1993).*

(Continued)

*Primary Examiner*—Yogendra N. Gupta
*Assistant Examiner*—Matthew J. Song
(74) *Attorney, Agent, or Firm*—McDermott Will & Emery LLP

(57) ABSTRACT

A method for manufacturing a semiconductor substrate of the present invention includes the steps of: (a) providing a support substrate; (b) epitaxially growing a first semiconductor layer on the support substrate; (c) epitaxially growing a second semiconductor layer on the first semiconductor layer; and (d) forming a semiconductor substrate including the first semiconductor layer and the second semiconductor layer by removing the support substrate, wherein an interatomic distance of atoms of the support substrate to which atoms of the first semiconductor layer attach and an interatomic distance of atoms of the second semiconductor layer have the same magnitude relationship with respect to an interatomic distance of the atoms of the first semiconductor layer in an epitaxial growth plane.

3 Claims, 4 Drawing Sheets

FOREIGN PATENT DOCUMENTS

| | | | | |
|---|---|---|---|---|
| JP | 05206026 | A | * | 8/1993 |
| JP | 10335750 | A | * | 12/1998 |
| JP | 2000105321 | A | * | 4/2000 |
| JP | 2000-252224 | | | 9/2000 |
| WO | WO 9925030 | A1 | * | 5/1999 |
| WO | WO 00/33364 | | * | 6/2000 |

OTHER PUBLICATIONS

Patent Abstracts of Japan. English Abstract of JP 2000-105321 (2000).*

Olsen et al., "Calculated stresses in multilayered heteroepitaxial structures", Journal of Applied Physics, vol. 48, No. 6, Jun. 1977, pp. 2543-2547.*

* cited by examiner

METHOD FOR MANUFACTURING SEMICONDUCTOR SUBSTRATE

BACKGROUND OF THE INVENTION

The present invention relates to a method for manufacturing a semiconductor substrate, and more particularly to a method for manufacturing a group III nitride semiconductor substrate, which is used in a semiconductor laser device for emitting light of a short wavelength such as blue or violet, or in a transistor capable of operating at a high temperature.

A group III nitride semiconductor that is expressed by the general formula $B_xAl_yGa_zIn_{1-x-y-z}N$ ($0 \leq x \leq 1$, $0 \leq y \leq 1$, $0 \leq z \leq 1$, $0 \leq x+y+z \leq 1$) (hereinafter referred to simply as "group III nitride semiconductor") is a material used in optical devices for wavelengths ranging from red to ultraviolet, and is expected to be used in light-emitting devices and light-receiving devices. Unlike other group III-V compound semiconductors such as GaAs or InP, a group III nitride semiconductor such as GaN is difficult to obtain in the form of a high-quality, large-area, independent substrate. Therefore, a group III nitride semiconductor substrate of a satisfactory quality has been produced by depositing a group III nitride semiconductor layer on a heterogeneous substrate having a different lattice constant such as sapphire or SiC.

However, if a group III nitride semiconductor layer formed on a sapphire substrate is used in a semiconductor laser device or a transistor, it is necessary to form all electrodes on the group III nitride semiconductor layer because the sapphire substrate is an electrically non-conductive, or insulative, substrate. This complicates the manufacturing process and lowers the yield of a device that is made of a group III nitride semiconductor.

When an SiC substrate is used, even though an SiC substrate is conductive, a potential barrier is likely to be formed at the interface between the SiC substrate and the group III nitride semiconductor layer. Thus, when an electrode is formed on the lower surface of the SiC substrate, the operating voltage will be high.

In view of the above, attempts have been made in the art to obtain an independent group III nitride semiconductor substrate by forming a group III nitride semiconductor layer on a heterogeneous substrate such as a sapphire substrate or an SiC substrate and then separating the group III nitride semiconductor layer from the heterogeneous substrate.

A conventional method for manufacturing a group III nitride semiconductor substrate will now be described with reference to FIG. 2A to FIG. 2C.

First, in the step of FIG. 2A, a sapphire substrate 1 having a diameter of 2 inches and a thickness of 400 μm and whose upper surface is oriented in the (0001) direction is provided. Then, the sapphire substrate 1 is carried into a metal-organic chemical vapor deposition (hereinafter referred to as "MOCVD") reactor, in which it is heated to a temperature of about 1100° C. in a hydrogen atmosphere and held at that temperature for 10 minutes so as to clean the surface of the sapphire substrate 1. Then, the substrate temperature is decreased to about 550° C., and ammonium and trimethylgallium are introduced into the reactor so as to form a GaN buffer layer (not shown) having a thickness of about 200 Å on the sapphire substrate 1. Then, the supply of trimethylgallium is once stopped, and the substrate temperature is increased to about 1050° C. in the hydrogen/ammonium mixed atmosphere, after which the trimethylgallium supply is resumed so as to form a GaN layer 2 having a thickness of 10 μm on the sapphire substrate 1.

Then, in the step of FIG. 2B, the obtained substrate is taken out of the reactor, and a pulse laser beam of a YAG tertiary harmonic wave (wavelength: 355 nm) is illuminated from the lower surface of the sapphire substrate 1 onto the lower surface of the GaN layer 2 via the sapphire substrate 1 so that the entirety of the lower surface of the GaN layer 2 is scanned, with the substrate being heated to about 600° C. on a heating stage. Note that an arrow in FIG. 2B represents the laser beam. While the sapphire substrate 1 transmits the laser beam having a wavelength of 355 nm therethrough, the GaN layer 2 strongly absorbs the laser beam. Thus, the portion of the GaN layer 2 that is irradiated with the laser beam is heated by absorbing light so as to be decomposed into a metal (Ga) and a nitrogen gas. Eventually, the lower portion of the GaN layer 2 is decomposed.

Then, in the step of FIG. 2C, the sapphire substrate 1 and the GaN layer 2 are separated from each other so as to obtain an independent GaN substrate 4a.

However, with the conventional method described above, the GaN substrate 4a separated from the sapphire substrate 1 is substantially warped so as to protrude away from the sapphire substrate 1. When an SiC substrate is used, instead of the sapphire substrate 1, the GaN substrate 4a is substantially warped so as to protrude toward the SiC substrate.

In any case, where an independent group III nitride semiconductor substrate is obtained by forming a group III nitride semiconductor film on a heterogeneous substrate such as a sapphire substrate or an SiC substrate and then separating the group III nitride semiconductor film from the heterogeneous substrate, the group III nitride semiconductor substrate is deformed.

Deformation of the group III nitride semiconductor substrate makes it difficult to handle or process the independent group III nitride semiconductor substrate. Moreover, in a case where the independent group III nitride semiconductor substrate is used as a substrate on which another group III nitride semiconductor layer is deposited, if a group III nitride semiconductor substrate that is deformed as described above is used, it will be difficult to uniformly heat the entirety of the group III nitride semiconductor substrate in the reactor, and to uniformly grow a crystal.

Moreover, since a group III nitride semiconductor substrate inherently has a force of deforming itself as described above, a group III nitride semiconductor substrate is likely to be cracked during the step of illuminating a pulse laser beam, and it is difficult to obtain a large-area, independent group III nitride semiconductor substrate.

SUMMARY OF THE INVENTION

The present invention has been made in order to solve the problems as described above, and has an object to provide an independent semiconductor substrate with a reduced deformation.

A method for manufacturing a semiconductor substrate of the present invention includes the steps of: (a) providing a support substrate; (b) epitaxially growing a first semiconductor layer on the support substrate; (c) epitaxially growing a second semiconductor layer on the first semiconductor layer; and (d) forming a semiconductor substrate including the first semiconductor layer and the second semiconductor layer by removing the support substrate, wherein an interatomic distance of atoms of the support substrate to which atoms of the first semiconductor layer attach and an interatomic distance of atoms of the second semiconductor layer have the same magnitude relationship with respect to an interatomic distance of the atoms of the first semiconductor layer in an epitaxial growth plane.

According to the method for manufacturing a semiconductor substrate of the present invention, the interatomic distance "a" between the atoms of the support substrate to which the atoms of the first semiconductor layer attach, the interatomic distance "b" between the atoms of the first semiconductor layer, and the interatomic distance "c" between the atoms included in the material of the second semiconductor layer, are in the magnitude relationship: a<b and c<b; or a>b and c>b.

In a case where a<b and c<b, crystal defects are formed with a high density in the lower portion of the first semiconductor layer, which is closer to the support substrate, and with a low density in the upper portion thereof. Due to the distribution of crystal defects, the first semiconductor layer inherently has a force of deforming itself so as to protrude away from the support substrate. On the other hand, a substantial tensile strain occurs in the second semiconductor layer. Specifically, the second semiconductor layer inherently has a force of deforming itself so as to protrude toward the support substrate. Thus, the inherent force in the second semiconductor layer counteracts the inherent force in the first semiconductor layer. As a result, the deformation of the semiconductor substrate including the first semiconductor layer and the second semiconductor layer is very small.

In a case where a>b and c>b, crystal defects are formed with a low density in the lower portion of the first semiconductor layer, which is closer to the support substrate, and with a high density in the upper portion thereof Due to the distribution of crystal defects, the first semiconductor layer inherently has a force of deforming itself so as to protrude toward the support substrate. On the other hand, a substantial compressive strain occurs in the second semiconductor layer. Specifically, the second semiconductor layer inherently has a force of deforming itself so as to protrude away from the support substrate. Thus, the inherent force in the second semiconductor layer counteracts the inherent force in the first semiconductor layer. As a result, the deformation of the semiconductor substrate including the first semiconductor layer and the second semiconductor layer is very small.

In one embodiment of the present invention, in the step (d), a light beam that is transmitted through the support substrate and is absorbed by the first semiconductor layer is illuminated onto the first semiconductor layer via the support substrate so as to decompose a lower portion of the first semiconductor layer, and then the support substrate is separated from the semiconductor substrate including the first semiconductor layer and the second semiconductor layer.

In one embodiment of the present invention: the first semiconductor layer is made of a group III nitride semiconductor; and the second semiconductor layer is made of a group III nitride semiconductor.

In one embodiment of the present invention: the support substrate is a sapphire substrate; the first semiconductor layer is made of $Al_xGa_{1-x}N$; the second semiconductor layer is made of $Al_yGa_{1-y}N$; and $0 \leq x<y \leq 1$.

DESCRIPTION OF THE PREFERRED EMBODIMENTS

Figure 2A:
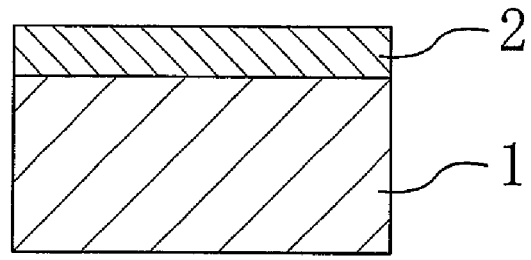
FIG. 2A to FIG. 2C are cross-sectional view illustrating a conventional method for manufacturing a group III nitride semiconductor substrate.
Figure 2B:
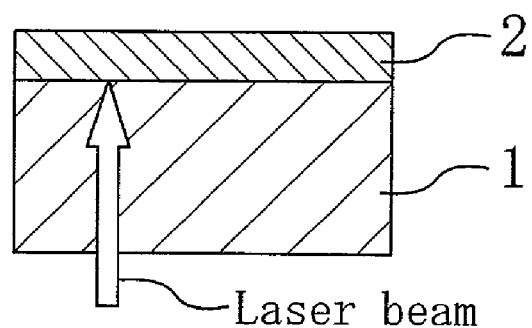
Figure 2C:
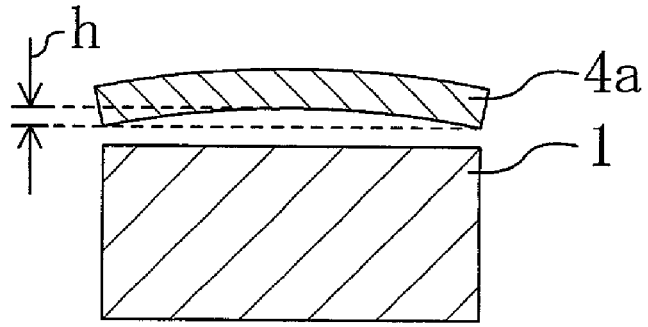
Figure 3:
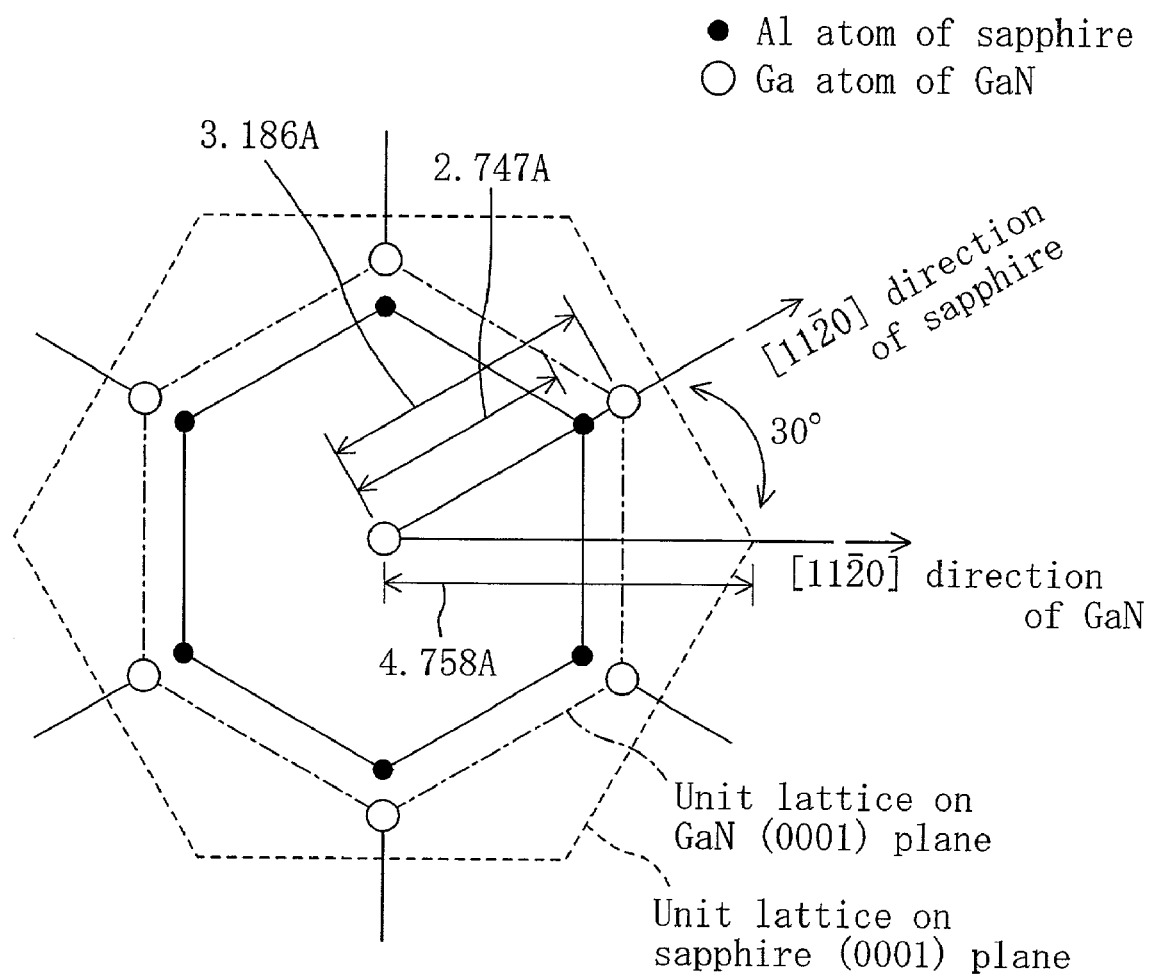
FIG. 3 is a schematic diagram illustrating an atomic arrangement at the interface between the sapphire substrate (0001) plane and the GaN layer (0001) plane.
Figure 4:
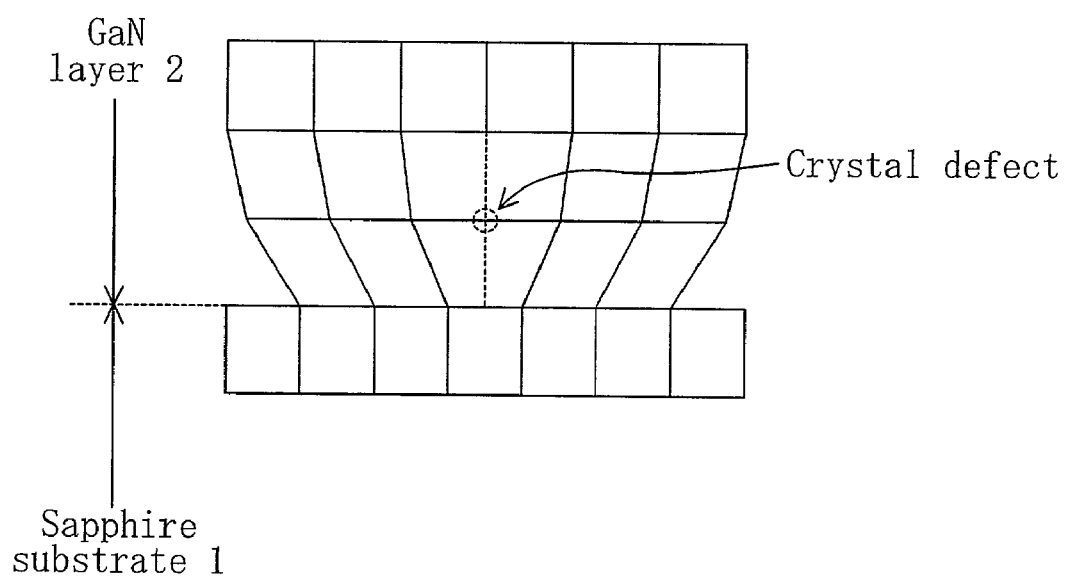
FIG. 4 is a schematic cross-sectional view illustrating an atomic arrangement in the vicinity of the interface between the sapphire substrate 1 and the GaN layer 2.

As described above, in a case where an independent group III nitride semiconductor substrate is obtained by forming a group III nitride semiconductor film on a heterogeneous substrate such as a sapphire substrate or an SiC substrate and then separating the group III nitride semiconductor film from the heterogeneous substrate, as in the prior art, the obtained group III nitride semiconductor substrate is deformed. In view of this, the present inventors made a research on the mechanism by which the obtained group III nitride semiconductor substrate is deformed with the conventional method for manufacturing a group III nitride semiconductor substrate. The mechanism by which the GaN substrate 4a is deformed with the conventional technique will now be described with reference to FIG. 2A to FIG. 4. FIG. 3 is a schematic diagram illustrating an atomic arrangement at the interface between the sapphire substrate (0001) plane and the GaN layer (0001) plane. FIG. 4 is a schematic cross-sectional view illustrating an atomic arrangement in the vicinity of the interface between the sapphire substrate 1 and the GaN layer 2.

It is generally believed that sapphire has a lattice constant of 4.758 Å and GaN has a lattice constant of 3.186 Å. However, in a case where the GaN layer 2 is deposited on the sapphire substrate 1, it is known that, in view of the crystal orientation in the plane that is parallel to the interface between the sapphire substrate 1 and the GaN layer 2 (i.e., in the epitaxial growth plane), the [11-20] direction of the sapphire substrate 1 and the [11-20] direction of the GaN layer 2 are at an angle of 30° with respect to each other, as illustrated in FIG. 3.

Note that the expression of crystal orientation "[11-20]" is used herein to represent "[11$\bar{2}$0]".

Specifically, the GaN layer 2 is formed by the attachment (binding) of Ga atoms to Al atoms of the sapphire substrate 1 via N atoms (not shown), as illustrated in FIG. 3. The interatomic distance of Al in the sapphire substrate 1 is 2.747 Å, which is smaller than that of Ga in the GaN layer 2 (3.186 Å). Therefore, in the beginning of the deposition of the GaN layer 2, a substantial compressive strain occurs in the GaN layer 2, as illustrated in FIG. 4. A large amount of crystal defects as illustrated in FIG. 4 are produced in the GaN layer 2 in order to relieve the compressive strain. The amount of crystal defects to be produced is reduced as the deposition of the GaN layer 2 progresses.

According to the experiment conducted by the present inventors, crystal defects are formed at a high density of $10^{10}$ cm$^{-2}$ or more in the area within about 3000 Å from the lower surface of the GaN layer 2, and the density of the crystal defects rapidly decreases to a substantially constant value of about $3 \cdot 10^9$ cm$^{-2}$ in the area at a distance of about 3000 Å or more away from the lower surface of the GaN layer 2.

The experimental result means that the interatomic distance of Ga in the GaN layer 2 containing a large amount of crystal defects in the beginning of the deposition process is smaller than the intrinsic interatomic distance of Ga in GaN (i.e., closer to the interatomic distance of Al in sapphire), and it gradually increases to the intrinsic interatomic distance of Ga in GaN as the deposition process progresses. Thus, the GaN layer 2 inherently has a force of deforming itself so as to protrude away from the sapphire substrate 1. Therefore, the independent GaN substrate 4a obtained by separating the sapphire substrate 1 and the GaN layer 2 from each other through irradiation with a pulse laser beam deforms so as to protrude away from the sapphire substrate 1, as illustrated in FIG. 2C. According to a measurement taken by the present inventors, the amount of deformation (the width denoted by "h" in FIG. 2C) of the GaN substrate 4a having a diameter of 2 inches (about 5 cm) was as much as about 5 mm.

The following embodiment of the present invention has been made based on the researches above.

Embodiment

Figure 1A:
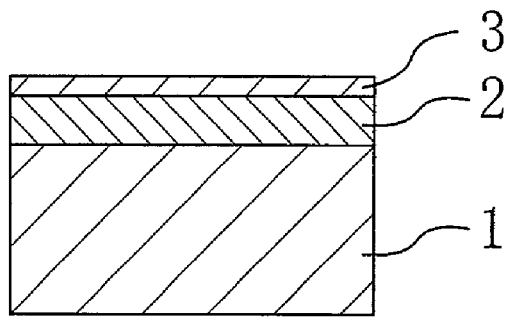
FIG. 1A to FIG. 1C are cross-sectional views illustrating a method for manufacturing a group III nitride semiconductor substrate according to an embodiment of the present invention.
Figure 1B:
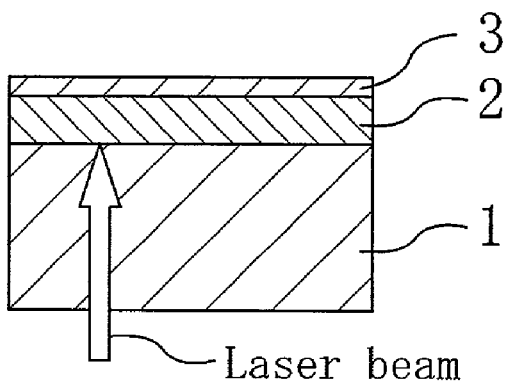
Figure 1C:
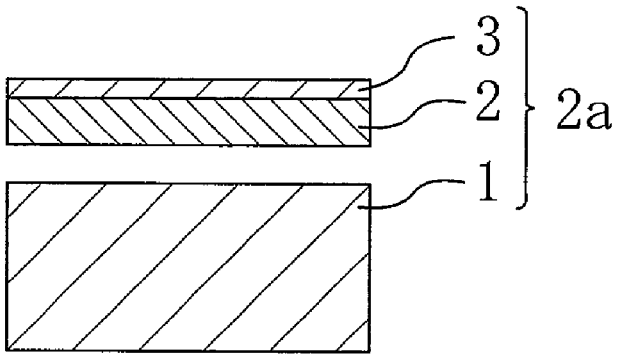

A method for manufacturing a group III nitride semiconductor substrate according to an embodiment of the present invention will now be described with reference to FIG. 1A to FIG. 1C. FIG. 1A to FIG. 1C illustrate a method for manufacturing a group III nitride semiconductor substrate according to the embodiment of the present invention.

First, referring to FIG. 1A, the sapphire substrate 1 having a diameter of 2 inches and a thickness of 400 μm and whose upper surface is oriented in the (0001) direction is carried into an MOCVD reactor, and held at about 1100° C. in a hydrogen atmosphere for 10 minutes so as to clean the surface of the sapphire substrate 1. Then, the temperature of the sapphire substrate 1 is decreased to about 550° C., and ammonium and trimethylgallium are introduced into the reactor so as to epitaxially grow a GaN buffer layer (not shown) having a thickness of about 200 Å on the sapphire substrate 1. Then, the supply of trimethylgallium is once stopped, and the substrate temperature is increased to about 1050° C. in the hydrogen/ammonium mixed atmosphere, after which the trimethylgallium supply is resumed so as to epitaxially grow the GaN layer 2 having a thickness of 10 μm on the sapphire substrate 1. Then, trimethylaluminum is introduced into the reactor so as to epitaxially grow an AlGaN layer 3 ($Al_{0.2}Ga_{0.8}N$) having a thickness of 1 μm and an Al composition ratio of 0.2 on the GaN layer 2.

Then, in the step of FIG. 1B, the obtained substrate is taken out of the reactor, and a pulse laser beam (pulse width: 10 nsec) of a YAG tertiary harmonic wave (wavelength: 355 nm) is illuminated from the lower surface of the sapphire substrate 1 onto the lower surface of the GaN layer 2 so that the entirety of the lower surface of the GaN layer 2 is scanned, with the substrate being heated to about 600° C. on a heating stage. When the energy density of the pulse laser beam is about 0.3 J/cm$^2$ or more, an area of the lower surface of the GaN layer 2 that is irradiated with the laser beam changes its color to gray (originally colorless), which can be observed by human eyes. This occurs as the lower portion of the GaN layer 2 is thermally decomposed by the pulse laser beam and the metal (Ga) is separated.

Then, in the step of FIG. 1C, the GaN layer 2 and the AlGaN layer 3 are completely separated from the sapphire substrate 1, thus obtaining an independent group III nitride semiconductor substrate 2a including the GaN layer 2 and the AlGaN layer 3. The group III nitride semiconductor substrate 2a is substantially flat, with the amount of deformation being 5 μm or less.

As illustrated in FIG. 4, due to the mismatch between the interatomic distance of Al in the sapphire substrate 1 and the interatomic distance of Ga in the GaN layer 2, crystal defects are formed with a high density in the lower portion of the GaN layer 2, which is closer to the sapphire substrate 1, and with a low density in the upper portion thereof Due to the distribution of crystal defects, the GaN layer 2 inherently has a force of deforming itself so as to protrude away from the sapphire substrate 1.

On the other hand, the interatomic distance of Al and Ga in the AlGaN layer 3 having an Al composition ratio of 0.2 is about 3.174 Å, which is smaller than that of Ga in GaN (about 3.189 Å). This causes a substantial tensile strain in the AlGaN layer 3. Thus, the AlGaN layer 3 inherently has a force of deforming itself so as to protrude toward the sapphire substrate 1.

The inherent force in the AlGaN layer 3 counteracts the inherent force in the GaN layer 2 described above. As a result, the deformation of the group III nitride semiconductor substrate 2a including the GaN layer 2 and the AlGaN layer 3, which are separated from the sapphire substrate 1, is very small.

The magnitude of the force that urges the GaN layer 2 to deform so as to protrude away from the sapphire substrate 1, due to the mismatch between the interatomic distance of Al in the sapphire substrate 1 and the interatomic distance of Ga in the GaN layer 2, varies depending on various deposition conditions such as the thickness of the GaN buffer layer, the temperature at which the GaN layer 2 is deposited, the mixing ratio of the material gas used in the deposition of the GaN layer 2, and the deposition rate. However, optimal Al composition ratio and thickness of the AlGaN layer 3 can be determined experimentally. In the case of $Al_xGa_{1-x}N$, the interatomic distance of Al and Ga generally decreases as the value of x increases.

Although the present embodiment has been described above with respect to a method for manufacturing a group III nitride semiconductor substrate made of $Al_xGa_{1-x}N$ ($0 \leq x \leq 1$), the present invention is not limited thereto. The present invention can be applied widely to methods for obtaining a semiconductor substrate by separating a support substrate (the sapphire substrate 1 in the present embodiment) and a first semiconductor layer (the GaN layer 2 in the present embodiment) formed thereon from each other, wherein the interatomic distance "a" between the atoms of the support substrate (Al atoms of the sapphire substrate 1 in the present embodiment) to which the atoms included in the material of the semiconductor layer attach is different from the interatomic distance "b" between the atoms included in the material of the semiconductor layer (Ga atoms of the GaN layer 2 in the present embodiment). For example, the first semiconductor layer may be a layer of $B_xAl_yGa_zIn_{1-x-y-z}N$ ($0 \leq x \leq 1$, $0 \leq y \leq 1$, $0 \leq z \leq 1$, $0 \leq x+y+z \leq 1$).

Another semiconductor layer (the AlGaN layer 3 in the present embodiment) formed on the semiconductor layer may be a layer of $B_xAl_yGa_zIn_{1-x-y-z}N$ ($0 \leq x \leq 1$, $0 \leq y \leq 1$, $0 \leq z \leq 1$, $0 \leq x+y+z \leq 1$).

Although the present embodiment has been described above with respect to a case where the interatomic distance "a" is smaller than the interatomic distance "b", and an interatomic distance "c" between the atoms included in the material of the other semiconductor layer (Al and Ga atoms of the AlGaN layer 3 in the present embodiment) is smaller than the interatomic distance "b" (i.e., a<b and c<b), the present invention is not limited thereto. Alternatively, the relationship may be reversed (i.e., a>b and c>b). In such a case, although a force of deforming the group III nitride semiconductor substrate 2a so as to protrude toward the support substrate occurs in the first semiconductor layer, the deformation of the group III nitride semiconductor substrate 2a can be suppressed by setting the interatomic distance "c" to be greater than the interatomic distance "b".

Although the present embodiment has been described above with respect to a method for manufacturing a group III nitride semiconductor substrate that only includes two layers, i.e., the GaN layer 2 and the AlGaN layer 3, the present invention is not limited thereto. For example, effects as those described above can be obtained also with three or more layers by appropriately selecting the composition and thickness of each layer so as to minimize the deformation occurring when the layers are separated from the sapphire substrate 1. For example, in the present embodiment, the uppermost layer of the independent group III nitride semiconductor substrate 2a is the AlGaN layer 3. However, AlGaN is reactive with oxygen in the air, and thus may possibly cause problems in subsequent processes. In view of this, a GaN layer may be formed further on the upper surface of the AlGaN layer 3. In such a case, the GaN layer formed last reduces the effect of the AlGaN layer 3 suppressing the deformation of the group III nitride semiconductor substrate 2a. The effect of suppressing the deformation of the group III nitride semiconductor substrate 2a can be increased by increasing the Al composition ratio or the thickness of the AlGaN layer 3.

Although the thickness of the GaN layer 2 is set to be 10 μm, and the thickness of the AlGaN layer 3 is set to be 1 μm in the present embodiment, the present invention is not limited thereto. Nevertheless, in order to ensure a sufficient mechanical strength of the independent group III nitride semiconductor substrate 2a, it is preferred to set the total thickness of the GaN layer 2 and the AlGaN layer 3 to be 3 μm or more.

Although the present embodiment has been described above with respect to a method in which the sapphire substrate 1 is separated from the group III nitride semiconductor substrate 2a by using a pulse laser beam, the present invention is not limited thereto. For example, the sapphire substrate 1 may be removed by wet etching.

Although a sapphire substrate is used as the support substrate in the present embodiment, the present invention is not limited thereto. For example, the support substrate may be a substrate of 6H—SiC, Si, GaAs, etc.

What is claimed is:

1. A method for manufacturing a semiconductor substrate, comprising the steps of:
   (a) providing a support substrate;
   (b) epitaxially growing a first semiconductor layer on the support substrate;
   (c) epitaxially growing a second semiconductor layer directly on the first semiconductor layer; and
   (d) forming a semiconductor substrate including the first semiconductor layer and the second semiconductor layer by removing the support substrate with laser irradiation,
   wherein a lower portion of the first semiconductor layer has a density of defects higher than that of an upper portion of the first semiconductor layer,
   an interatomic distance of atoms of the support substrate to which atoms of the first semiconductor layer attach and an interatomic distance of atoms of the second semiconductor layer have the same magnitude relationship with respect to an interatomic distance of the atoms of the first semiconductor layer in an epitaxial growth plane,
   a total thickness of the first semiconductor layer and the second semiconductor layer is at least 3 μm but not more than 11 μm, and
   in the step (d), a light beam that is transmitted through the support substrate and is absorbed by the first semiconductor layer is illuminated onto the first semiconductor layer via the support substrate so as to decompose a lower portion of the first semiconductor layer, and then the support substrate is separated from the semiconductor substrate including the first semiconductor layer and the second semiconductor layer.

2. The method for manufacturing a semiconductor substrate of claim 1, wherein:
   the first semiconductor layer is made of a group III nitride semiconductor; and
   the second semiconductor layer is made of a group III nitride semiconductor.

3. The method for manufacturing a semiconductor substrate of claim 2, wherein:
   the support substrate is a sapphire substrate;
   the first semiconductor layer is made of $Al_xGa_{1-x}N$;
   the second semiconductor layer is made of $Al_yGa_{1-y}N$; and $0 \leq x < y \leq 1$.

* * * * *